United States Patent
Doornbos et al.

(10) Patent No.: US 7,838,371 B2
(45) Date of Patent: Nov. 23, 2010

(54) METHOD OF MANUFACTURING A FET GATE

(75) Inventors: Gerben Doornbos, Kessel-L9 (BE); Radu Surdeanu, Roosbeek (BE)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 12/513,548

(22) PCT Filed: Oct. 25, 2007

(86) PCT No.: PCT/IB2007/054350
§ 371 (c)(1),
(2), (4) Date: May 5, 2009

(87) PCT Pub. No.: WO2008/056289
PCT Pub. Date: May 15, 2008

(65) Prior Publication Data
US 2010/0068859 A1    Mar. 18, 2010

(30) Foreign Application Priority Data
Nov. 6, 2006    (EP)  .................................. 06123538

(51) Int. Cl.
*H01L 21/336*    (2006.01)
(52) U.S. Cl. .................. 438/299; 438/669; 438/585; 257/407; 257/E21.196; 257/E29.152
(58) Field of Classification Search .................. 438/299, 438/585, 669, 926, 301; 257/327, 407, E29.152, 257/E21.196
See application file for complete search history.

(56) References Cited

U.S. PATENT DOCUMENTS

| 4,312,680 | A | * | 1/1982 | Hsu | 438/151 |
| 4,358,340 | A | * | 11/1982 | Fu | 438/585 |
| 4,419,809 | A | * | 12/1983 | Riseman et al. | 438/231 |
| 4,442,589 | A | * | 4/1984 | Doo et al. | 438/297 |
| 4,532,698 | A | * | 8/1985 | Fang et al. | 438/286 |
| 4,559,693 | A | * | 12/1985 | Kamei | 438/179 |
| 4,597,827 | A | * | 7/1986 | Nishitani et al. | 438/227 |
| 4,729,966 | A | * | 3/1988 | Koshino et al. | 438/177 |
| 4,769,339 | A | * | 9/1988 | Ishii | 438/179 |
| 4,803,181 | A | * | 2/1989 | Buchmann et al. | 438/696 |
| 4,849,069 | A | * | 7/1989 | Evans et al. | 438/619 |

(Continued)

FOREIGN PATENT DOCUMENTS

EP    0856892    *   5/1998

(Continued)

OTHER PUBLICATIONS

Shur, Michael; "Split-Gate Field-Effect Transistor"; Applied Physics Letter, vol. 54, p. 162-164; Jan. 9, 1989.

(Continued)

*Primary Examiner*—Mary Wilczewski

(57) ABSTRACT

A method of manufacturing a FET gate with a plurality of materials includes depositing a dummy region 8, and then forming a plurality of metallic layers 16, 18, 20 on gate dielectric 6 by conformally depositing a layer of each metallic layer and then anisotropically etching back to leave the metallic layer on the sides 10 of the dummy region. The dummy region is then removed leaving the metallic layers 16, 18, 20 as the gate over the gate dielectric 6.

10 Claims, 5 Drawing Sheets

U.S. PATENT DOCUMENTS

| | | | | |
|---|---|---|---|---|
| 4,851,365 A * | 7/1989 | Jeuch | | 438/257 |
| 5,202,272 A * | 4/1993 | Hsieh et al. | | 438/301 |
| 5,391,510 A * | 2/1995 | Hsu et al. | | 438/301 |
| 5,459,091 A * | 10/1995 | Hwang | | 438/257 |
| 5,612,255 A * | 3/1997 | Chapple-Sokol et al. | | 438/197 |
| 5,705,414 A * | 1/1998 | Lustig | | 438/585 |
| 5,866,934 A * | 2/1999 | Kadosh et al. | | 257/368 |
| 5,923,981 A * | 7/1999 | Qian | | 438/284 |
| 5,950,091 A * | 9/1999 | Fulford et al. | | 438/303 |
| 6,066,534 A * | 5/2000 | Son | | 438/299 |
| 6,124,174 A * | 9/2000 | Gardner et al. | | 438/303 |
| 6,184,116 B1 * | 2/2001 | Shen et al. | | 438/587 |
| 6,225,201 B1 * | 5/2001 | Gardner et al. | | 438/585 |
| 6,225,669 B1 * | 5/2001 | Long et al. | | 257/401 |
| 6,300,177 B1 | 10/2001 | Sundaresan et al. | | |
| 6,300,221 B1 | 10/2001 | Roberds et al. | | |
| 6,383,872 B1 * | 5/2002 | Kadosh et al. | | 438/279 |
| 6,586,808 B1 | 7/2003 | Xiang et al. | | |
| 6,610,604 B1 * | 8/2003 | Ang et al. | | 438/694 |
| 6,664,153 B2 * | 12/2003 | Ang et al. | | 438/197 |
| 6,727,560 B1 * | 4/2004 | Pan et al. | | 257/412 |
| 6,849,509 B2 * | 2/2005 | Barnak et al. | | 438/275 |
| 6,849,511 B2 * | 2/2005 | Iriyama et al. | | 438/275 |
| 6,864,163 B1 * | 3/2005 | Yu et al. | | 438/585 |
| 7,033,888 B2 * | 4/2006 | Pan et al. | | 438/257 |
| 7,056,794 B2 * | 6/2006 | Ku et al. | | 438/287 |
| 7,285,829 B2 * | 10/2007 | Doyle et al. | | 257/368 |
| 7,517,806 B2 * | 4/2009 | Bryant et al. | | 438/734 |
| 7,566,937 B2 * | 7/2009 | Wang et al. | | 257/407 |
| 7,675,097 B2 * | 3/2010 | Adkisson et al. | | 257/292 |
| 2003/0003666 A1 * | 1/2003 | Iriyama et al. | | 438/275 |
| 2005/0037343 A1 * | 2/2005 | Fagnani et al. | | 435/6 |
| 2005/0224886 A1 * | 10/2005 | Doyle et al. | | 257/368 |
| 2007/0262395 A1 * | 11/2007 | Gibbons et al. | | 257/392 |
| 2009/0137090 A1 * | 5/2009 | Chen et al. | | 438/278 |
| 2010/0001323 A1 * | 1/2010 | Tateshita | | 257/288 |
| 2010/0068877 A1 * | 3/2010 | Yeh et al. | | 438/592 |
| 2010/0124818 A1 * | 5/2010 | Lee et al. | | 438/589 |

FOREIGN PATENT DOCUMENTS

| | | |
|---|---|---|
| JP | 62 073668 A1 | 4/1987 |
| KR | 2010015071 * | 2/2010 |
| WO | 03/058711 A1 | 7/2003 |

OTHER PUBLICATIONS

Long, Wei, et al; "Dual-Material Gate (DMG) Field Effect Transistor"; IEEE Transactions on Electronic Devices; vol. 46, p. 865-870; May 1999.

* cited by examiner

METHOD OF MANUFACTURING A FET GATE

The invention relates to a method of fabricating the gate of a FET and especially to a method of manufacturing a gate of FET with a plurality of different metallic layers.

The intrinsic performance of MOSFETs in terms of current drive, switching power, transconductance and frequency has increased dramatically over several decades. There are a number of developments that have led to these improvements, including for example novel materials, advanced process steps and novel device architectures. One of the most important developments for improving performance has been the reduction in the MOSFET gate length.

However, as the MOSFET gate length shrinks to deep sub-micron length scales, much less than 1 µm in length, intrinsic device performance degrades for a number of reasons, collectively known as short-channel effects. One effect is drain induced barrier lowering (DIBL) which occurs as the channel length becomes comparable to the channel depth. In this case, the gate gradually loses the control over the channel to the drain so when the drain voltage changes this results in a change in the threshold voltage. A second effect is that hot carriers accelerated by high electric fields cause impact ionization. A third effect is that the pinch-off position moves towards the source at high drain bias. This means that the channel length varies with drain bias resulting in a finite output conductance.

A further short-channel effect is gate transport efficiency. Charge carriers overcome a potential barrier near the source and are injected into channel with low velocity. They are then accelerated towards the drain. The current is however largely determined by the low velocity at the potential barrier near the source.

A number of novel architectures using a thin silicon body have been proposed for use after the 65 nm roadmap node published by the International Technology Roadmap for Semiconductors (ITRS). These architectures include fully depleted silicon on insulator (FDSOI) or dual gate FinFETS. However, neither of these approaches address the gate transport efficiency.

A theoretical approach to this problem was proposed in M Shur, "Split gate field effect transistor", Appl. Phys. Lett volume 54 (1989) page 162, which demonstrated theoretically that a MOSFET with a longitudinally varying threshold voltage (along the gate length) has improved gate transport properties. The proposed practical implementation was a FET with a split gate, the gate over the drain end of the channel having a positive bias offset, for the NMOS case. The effective gate overdrive (or swing), i.e. the applied voltage minus the threshold voltage, is hence less at the source end. This in turn results in a higher resistance at the source end which in turn leads to higher longitudinal electric fields at the source end. These higher fields increase the acceleration of charges at the source increasing the average velocity and hence the current.

This split-gate structure is however not practicable to manufacture. Another structure was proposed by Long et al, in "Dual material gate (DMG) field effect transistor", IEEE transactions on electronic devices, volume 46 (1999) page 865. This uses a gate made of two different metallic layers with different work functions along the length of the channel. In particular, for NMOS, the metallic layer gate above the source end of the channel has a higher work function resulting in a higher threshold voltage, hence lower gate overdrive, than the metallic layer gate above the drain end of the channel. For PMOS, the metallic layer gate above the source end should have a lower work function.

Long et al even manufactured a device with a 1 µm length, using tilt evaporation.

However, as far as the present inventors are aware, no scalable manufacturing methods capable of producing such longitudinally varying gate voltages even at very short gate lengths less than 100 nm has been proposed.

Accordingly, there remains a need for a suitable manufacturing process and scaled devices manufactured in accordance with the process.

According to the invention there is provided a method according to claim 1.

By defining the metallic layers on the sides of a dummy structure, very short gate length transistors may be manufactured with multiple gate metallic layers with different work functions.

Note that the term "metallic layer" as used in the present application includes layers of metals, conductive semiconductors such as doped polysilicon, as well as materials such as silicides and nitrides where these conduct.

Embodiments of the invention will now be described, purely by way of example, with reference to the accompanying drawings, in which.

The Figures are schematic and not to scale. In particular the vertical dimension of the side views is exaggerated for clarity.

A method according to a first embodiment of the invention will be described with reference to FIGS. 1 to 7. The method will be described with particular reference to the formation of a FET; those skilled in the art will appreciate that other components such as interconnects may also be formed.

Figure 1:
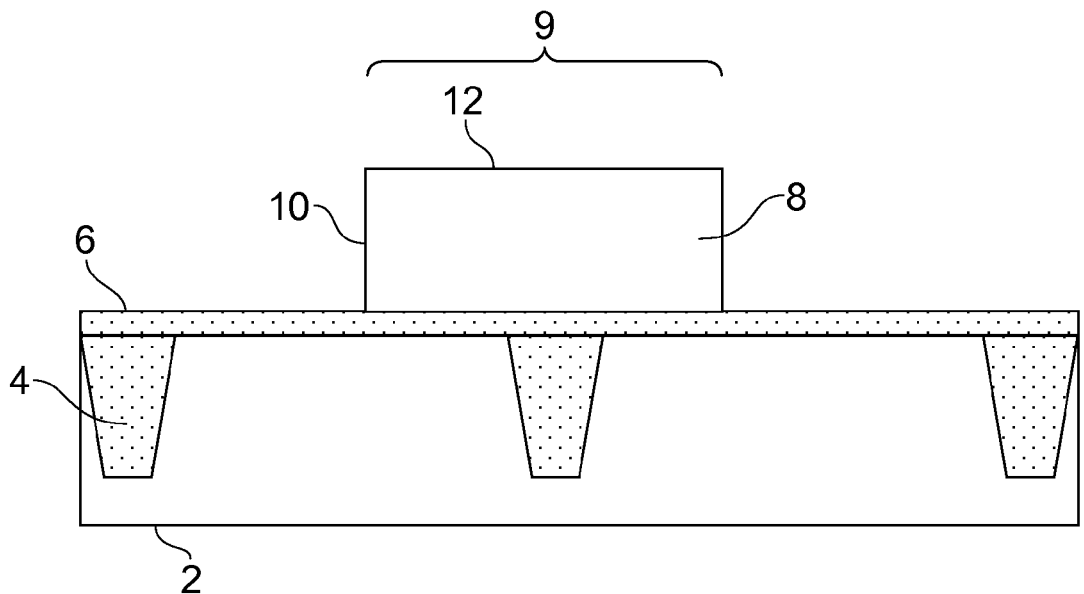
FIGS. 1 to 5 are side views in the steps of a first embodiment of a method of manufacturing a FET according to the invention.

Referring to FIG. 1, a semiconductor substrate 2 which in the example is of silicon has a number of isolation structures 4 formed in it, for example shallow trench isolation structures. A gate dielectric 6 is then formed on the upper surface of the substrate 2.

A dummy structure 8 is then formed above the gate dielectric by deposition of a layer of material, lithography to define dummy structure region 9 and etching. In the example, the dummy structure is formed of a 100 nm thick layer of polysilicon. This results in the structure of FIG. 1 in which the dummy structure 8 has sides 10 and a top 12.

Figure 2:
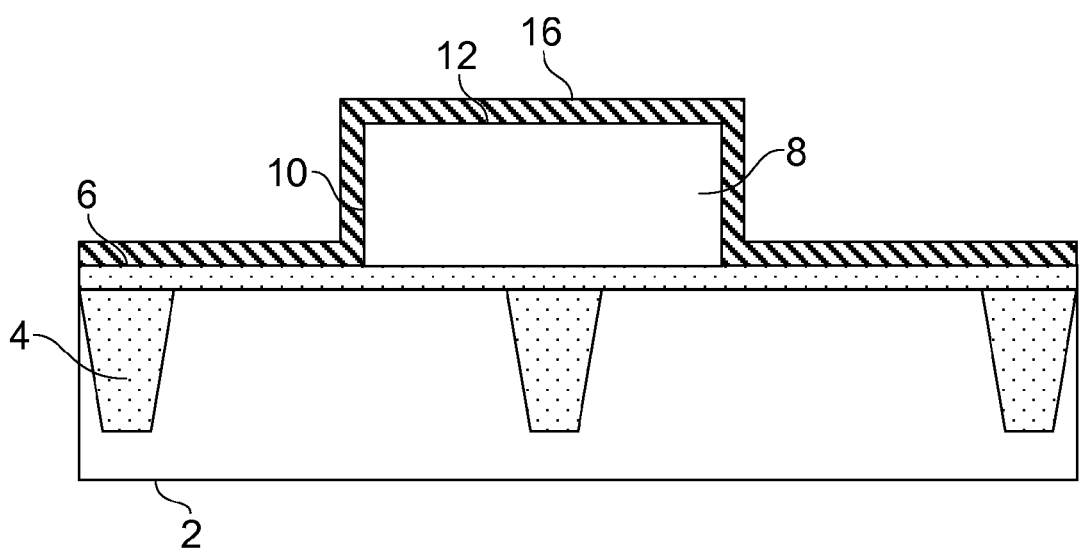

As illustrated in FIG. 2, a first metallic layer 16 with a first work function is deposited conformally, i.e. over the sides 10 of the dummy structure 8 as well as the top 12 of the dummy structure 8. A suitable conformal deposition technique is atomic layer deposition (ALD).

Figure 3:
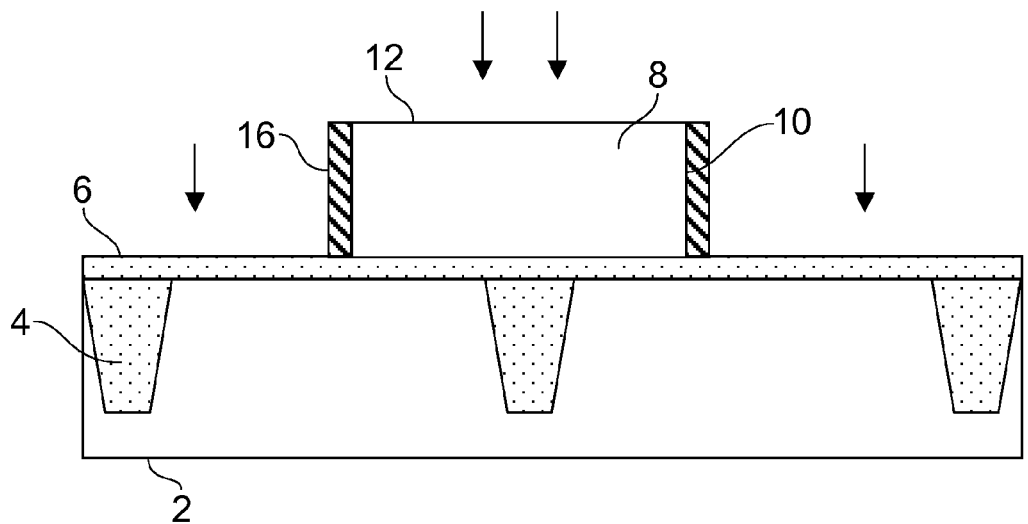

The next step is to anisotropically etch back the first metallic layer 16 to remove it from the top 12 of the dummy structure 8 and the top of the gate dielectric 6 while leaving a first metallic layer region 16 on the sides 10 of the dummy structure as illustrated in FIG. 3.

Next, the deposition and etch back processes of FIGS. 2 and 3 are repeated to deposit as many additional metallic layers as are required. First a metallic layer is deposited, and then the layer is etched back anisotropically to leave the metallic layer only on the sides 10 of the dummy structure.

Figure 4:
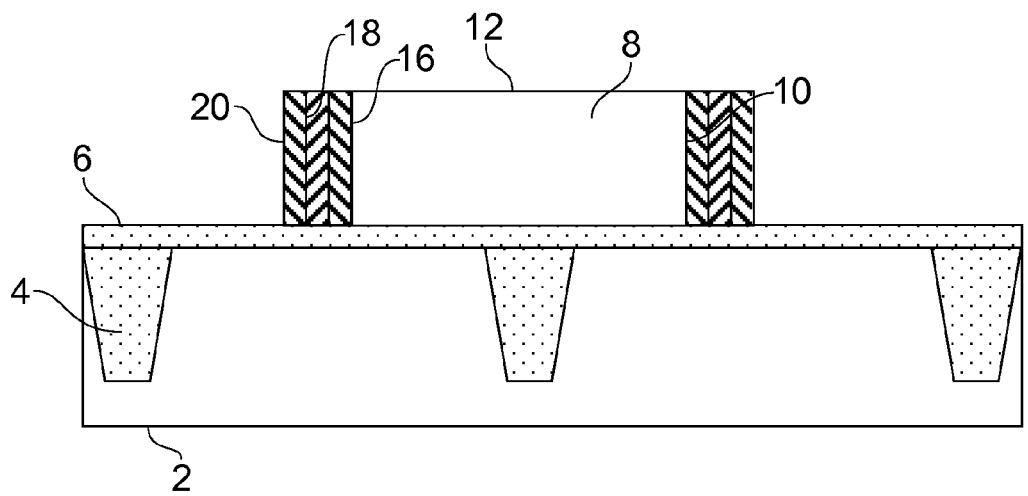

FIG. 4 illustrates the case where first metallic layer 16 of a metallic layer with a first work function, second metallic layer 18 of a second work function and third metallic layer 20 of a third work function are deposited on the sides 10 of the dummy structure 8. These first second and third metallic layers will together make up the gate of the FET being formed. Accordingly, the height of the dummy structure 8 determines the gate thickness and the total deposited thickness of metallic layer determines the gate length.

Figure 5:
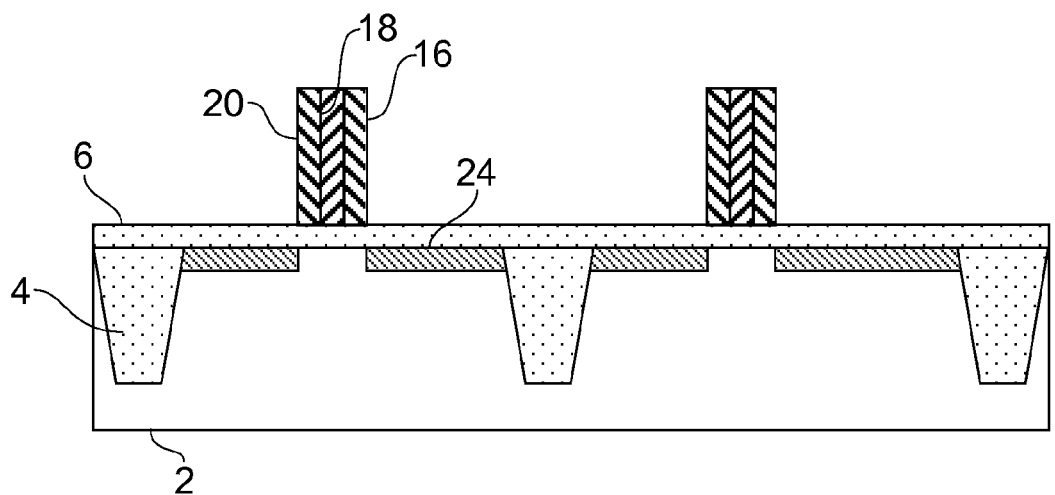

The dummy structure 8 is then removed by a selective etch and processing continues, by implanting forming low doped source 22 and drain 24 regions as illustrated in FIG. 5. Processing may then continue, for example by forming spacers and higher doped source and drain regions in the usual way.

Figure 6:
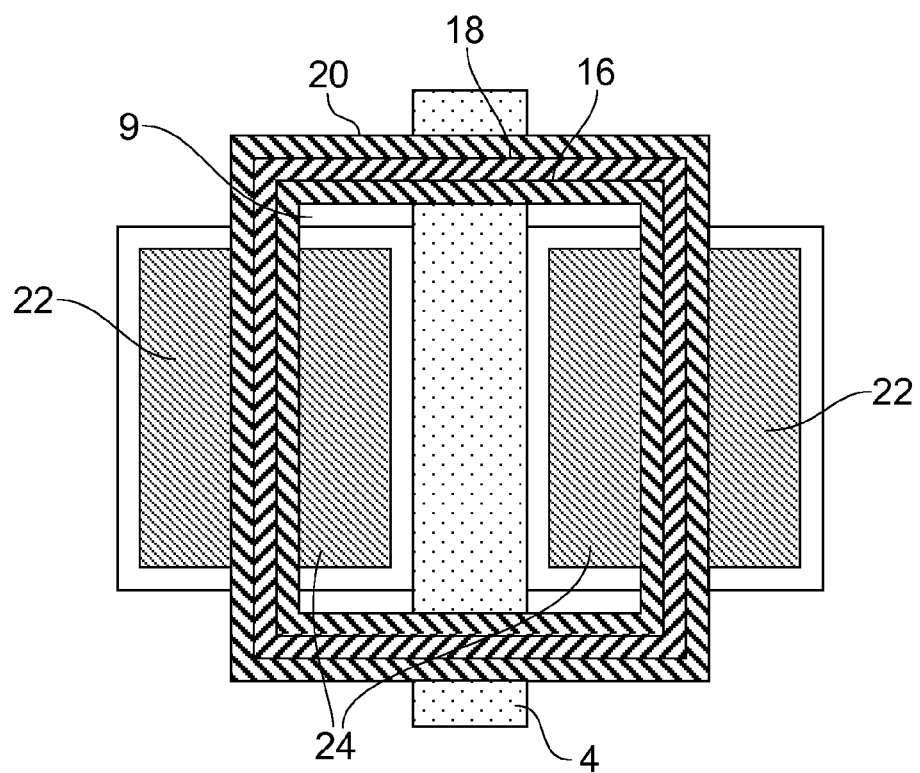
FIGS. 6 and 7 are top views of steps of the method of FIGS. 1 to 5.

FIG. 6 illustrates the step of FIG. 5 in top view. The metallic layers 16, 18, 20 may be seen surrounding a rectangle where the dummy structure 8 has been removed, the dummy structure region 9. It will be noted that the metallic layers 16, 18, 20 short the two transistors formed at this stage of the process.

Figure 7:
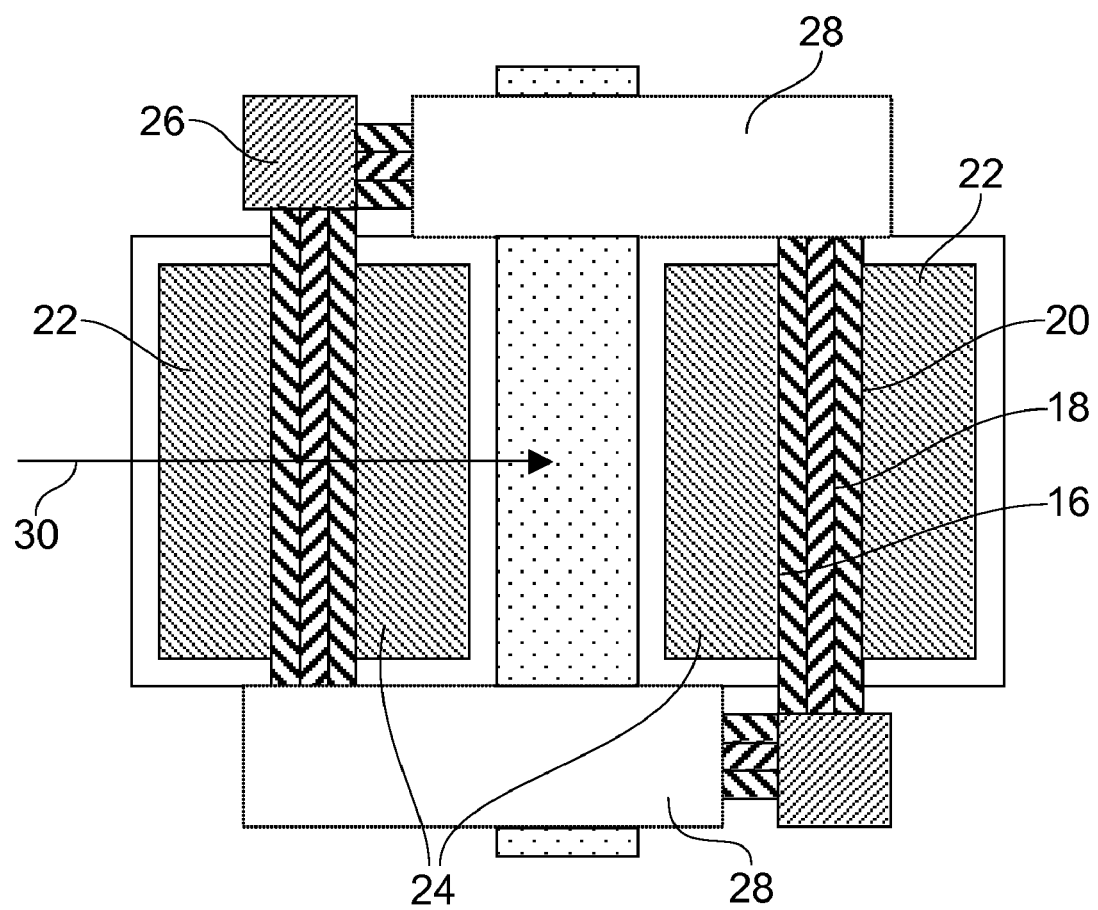

Thus, as illustrated in FIG. 7, a mask and etch step is used to remove the metallic layers 16, 18, 20 from regions 28 to disconnect the two transistors. Then, separate contacts 26 are formed to the individual transistors and processing continued to complete the pair of transistors.

The longitudinal (length) direction of the transistors is illustrated by arrow 30 in FIG. 7. It will be seen that the resulting transistor has three different gate metallic layers which may be selected to be of different work functions.

The method thus provides a way of making transistors with different work functions to reduce short gate length effects even with very short gate lengths in the range below 100 nm, since the length of the gate is determined by the thickness of metallic layers deposited for example by atomic layer deposition which may be accurately controlled.

With suitable choices of gate metallic layers, short channel effects will be suppressed and transport efficiency properties enhanced.

Note that in the embodiment shown a trench isolation structure 4 extends through the centre of the dummy structure region 9 and hence isolates the two transistors from each other.

In alternate embodiments (not shown) this isolation is omitted which means that the two drain regions 24 are connected to one another since there is a single implantation in the dummy structure region 9. Thus, in this case the transistors have a common drain. A common source can be provided in a similar fashion by forming the source regions 22 in common in the dummy structure region. Pairs of transistors with a common source or drain occur frequently in standard cell designs, and the embodiments provide a convenient approach to delivering them.

Figure 8:
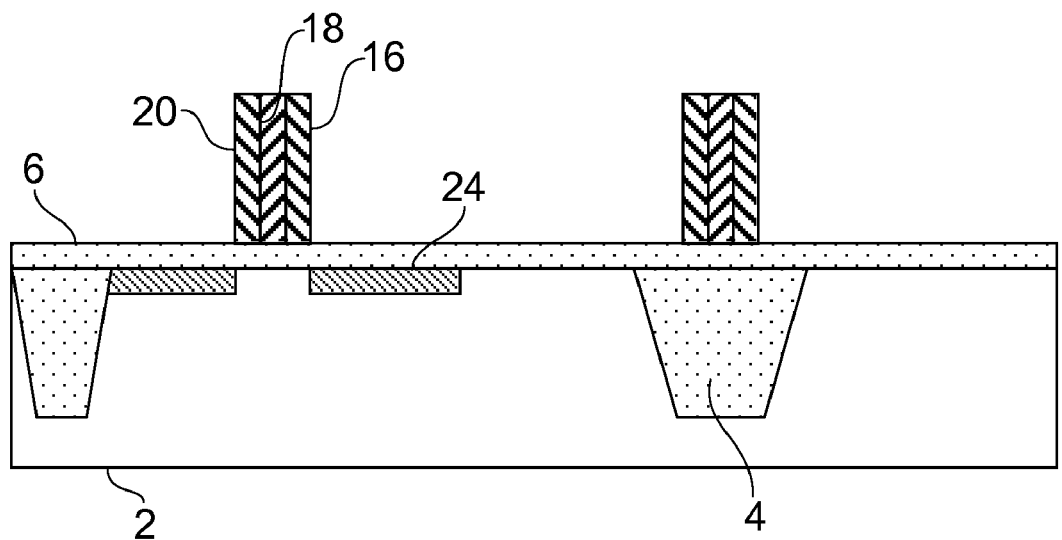
FIG. 8 is a side view of a step of a second embodiment of a method of manufacturing a FET according to the invention.
Figure 9:
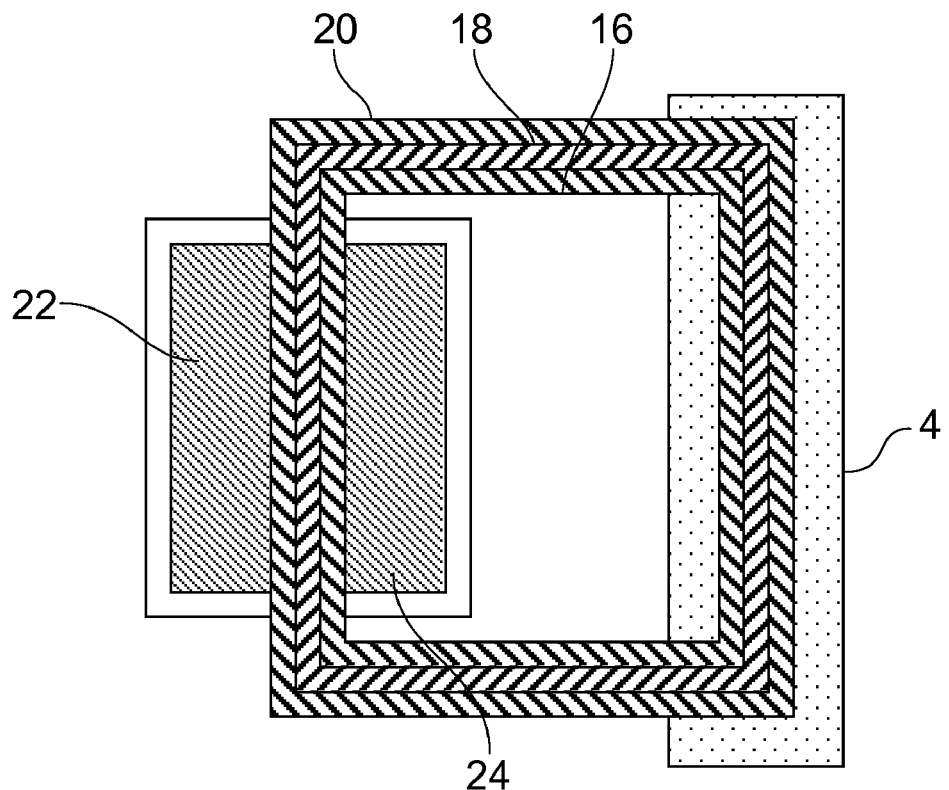
FIG. 9 is a top view of a step of the method of FIG. 8.

FIGS. 8 and 9 illustrate an alternative way of dealing with the fact that metallic layers 16, 18, 20 surround the dummy structure. In this second embodiment, one edge 10 of the dummy structure 8 is formed above the shallow trench isolation structure 4 as illustrated in FIG. 8.

Then, as illustrated in FIG. 9, when the dummy structure is removed the three metallic layers 16, 18, 20 serve only a single transistor. Contact 26 is formed to connect to the layers.

Thus, the second embodiment has the advantage that there is no need to etch away metallic layers 16, 18, 20 in regions 28 as in the first embodiment, saving the need for one mask and one etch step.

The invention delivers a varying threshold voltage along the length of the gate. In alternative arrangements, the metallic layer adjacent to the source and drain may be the same and a different metallic layer with a different work function provided in the central part of the gate over the central part of the channel. This provides a different set of properties.

Those skilled in the art will realise that many variations may be made to the transistors illustrated and indeed that the transistors may be included in many different processes.

The invention claimed is:

1. A method of manufacturing a field effect transistor (FET), comprising:
   depositing a gate dielectric over a semiconductor region;
   depositing a dummy structure over the gate dielectric in a dummy structure region and patterning the dummy structure to have defined edges;
   depositing a first metallic layer with a first work function conformally over the gate dielectric and dummy structure;
   etching back the first metallic layer selectively from the top of the dummy structure and the top of the gate dielectric leaving the first metallic layer on the sides of the dummy structure on the gate dielectric;
   depositing a second metallic layer with a second work function different to the first work function conformally over the gate dielectric and dummy structure and over the first metallic layer on the sides of the dummy structure;
   etching back the second metallic layer selectively from the top of the dummy structure and the top of the gate dielectric leaving a second metallic layer on the first metallic layer on the sides of the dummy structure on the gate dielectric;
   removing the dummy structure leaving the first and second metallic layers on the gate dielectric as gate metallic layer having a longitudinally varying work function; and
   implanting source and drain regions longitudinally adjacent to the first and second metallic layers to form a field effect transistor with a gate having a material that varies longitudinally along its length.

2. A method according to claim 1 further comprising depositing at least one further metallic layer conformally over the gate dielectric and dummy structure and over the first and second metallic layers on the sides of the dummy structure; and
   etching back the at least one further metallic layer selectively from the top of the dummy structure and the top of the gate dielectric leaving the at least one further metallic layer on the second metallic layer on the first metallic layer on the sides of the dummy structure on the gate dielectric before removing the dummy structure.

3. A method according to claim 1 further comprising forming a contact plug in contact with the metallic layers.

4. A method according to claim 1 wherein the metallic layers surround the dummy structure region, the method including forming a pair of FETs on opposed sides of the dummy structure region, the method further including the step of disconnecting the metallic layers joining the FETs on the opposed sides of the dummy structure region.

5. A method according to claim 4 further comprising forming the dummy structure over a shallow trench isolation structure and forming the pair of FETs on opposed sides of the dummy structure on opposite sides of the shallow trench isolation structure.

6. A method according to claim 4 wherein the pair of FETs share a common source or a common drain formed in the dummy structure region.

7. A method according to claim 1 wherein the metallic layers surround the dummy structure, the method including forming one edge of the dummy structure over a trench isolation structure and forming the FET on the opposite edge of the dummy structure.

8. A method according to claim 1 wherein the FET is an n-channel FET and the metallic layers are arranged in order of work function with the metallic layer with the highest work function adjacent the source and the metallic layer with the lowest work function adjacent the drain.

9. A method according claim 1 wherein the FET is a p-channel FET and the metallic layers are arranged in order of work function with the metallic layer with the lowest work function adjacent the source and the metallic layer with the highest work function adjacent the drain.

10. A method according claim 1 wherein there are at three metallic layers, the third metallic layer being of the same material as the first metallic layer but differing from the second metallic layer.

* * * * *